(12) United States Patent   (10) Patent No.: US 7,349,235 B2
Miyatake et al.   (45) Date of Patent: Mar. 25, 2008

(54) NON-VOLATILE MEMORY DEVICE

(75) Inventors: Hisatada Miyatake, Ohtsu (JP); Kohki Noda, Fujisawa (JP); Toshio Sunaga, Ohtsu (JP); Hiroshi Umezaki, Fujisawa (JP); Hideo Asano, Machida (JP); Koji Kitamura, Kusatsu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/381,578

(22) Filed: May 4, 2006

(65) Prior Publication Data

US 2006/0227600 A1   Oct. 12, 2006

Related U.S. Application Data

(62) Division of application No. 10/964,352, filed on Oct. 12, 2004, now Pat. No. 7,123,498, which is a division of application No. 10/057,369, filed on Jan. 24, 2002, now Pat. No. 6,826,076.

(30) Foreign Application Priority Data

Jan. 24, 2001   (JP)   ............................. 2001-015475

(51) Int. Cl.
   *G11C 5/08*   (2006.01)
(52) U.S. Cl. .................... 365/66; 365/63; 365/158; 365/100; 365/55; 365/48
(58) Field of Classification Search ............... 365/66, 365/63, 158, 100, 55, 48
   See application file for complete search history.

(56) References Cited

U.S. PATENT DOCUMENTS

| | | | | |
|---|---|---|---|---|
| 5,894,447 A * | 4/1999 | Takashima | ................. | 365/158 |
| 6,225,933 B1 * | 5/2001 | Salter et al. | ................. | 341/144 |
| 6,272,040 B1 * | 8/2001 | Salter et al. | ................. | 365/158 |
| 6,331,943 B1 * | 12/2001 | Naji et al. | .................. | 365/158 |
| 6,724,653 B1 * | 4/2004 | Iwata et al. | ................. | 365/158 |
| 6,826,076 B2 * | 11/2004 | Asano et al. | ............... | 365/158 |
| 6,879,513 B2 * | 4/2005 | Ooishi | ........................ | 365/158 |
| 6,901,025 B2 * | 5/2005 | Ooishi | ........................ | 365/233 |
| 6,903,964 B2 * | 6/2005 | Nahas et al. | ................ | 365/158 |
| 6,922,355 B2 * | 7/2005 | Hidaka | ....................... | 365/158 |
| 6,947,317 B2 * | 9/2005 | Iwata | ......................... | 365/158 |
| 6,990,024 B2 * | 1/2006 | Hidaka | .................. | 365/189.01 |
| 6,999,340 B2 * | 2/2006 | Shimizu | ..................... | 365/158 |
| 7,035,138 B2 * | 4/2006 | Ikeda et al. | ................. | 365/173 |
| 7,057,922 B2 * | 6/2006 | Fukumoto | ................... | 365/158 |
| 7,123,498 B2 * | 10/2006 | Miyatake et al. | ............. | 365/63 |
| 7,145,795 B2 * | 12/2006 | Ghodsi | ....................... | 365/158 |
| 2002/0006058 A1 * | 1/2002 | Nakajima et al. | ........... | 365/171 |

* cited by examiner

*Primary Examiner*—Viet Q. Nguyen
(74) *Attorney, Agent, or Firm*—Zilka-Kotab, PC

(57) ABSTRACT

A non-volatile memory device according to one embodiment includes a plurality of memory cells each comprising a magneto resistive element and a selection transistor, where the memory cells are arranged into a two dimensional array. A first interconnect line extends in a first direction of the memory array and functions as a gate electrode of a selection transistor included in each memory cell. A second interconnect line extends in the first direction of the memory array. A third interconnect line extends in a second direction. The magneto resistive element of at least some of the memory cells is sandwiched between the second and third interconnect lines.

11 Claims, 8 Drawing Sheets

NON-VOLATILE MEMORY DEVICE

RELATED APPLICATIONS

This application is a divisional of U.S. patent application Ser. No. 10/964,352, file Oct. 12, 2004, now U.S. Pat. No. 7,123,498 which is a divisional of U.S. patent application Ser. No. 10/057,369, filed Jan. 24, 2002, now U.S. Pat. No. 6,826,076.

BACKGROUND OF THE INVENTION

1. Field of the Invention

This invention relates to a non-volatile memory device, and more particularly, it relates to a technology useful for a memory device which utilizes the Magneto Resistive (MR) effect enabled by the tunneling effect.

2. Background of the Invention

In recent years, attention has been given to a Random Access Memory (RAM) using the Magneto Resistive Effect, wherein the resistance value of a magnetic substance varies depending on the magnetization direction of the substance by virtue of Magneto Resistive Effect. RAM using the Magnetic Resistive Effect is referred to as MRAM (Magneto-resistive RAM). For the Magneto Resistive Effect, the anisotropic Magneto Resistive Effect (AMR) and giant Magneto Resistive Effect (GMR) are known. It has also been known that higher filed sensitivity can be realized through the use of tunnel Magneto Resistive Effect (TMR), in which a tunnel current is used to achieve the Magneto Resistive Effect is also known.

A spin valve element using TMR, also referred to as a Magnetic Tunnel Junction (MTJ) element, has a laminated layer structure comprising an antiferromagnetic layer, ferromagnetic layer (pin layer), insulating layer (tunnel layer), and ferromagnetic layer (free layer). The antiferromagnetic layer functions to fix the magnetization direction of the ferromagnetic layer (pin layer) adjacent thereto, and the coincidence of the magnetization direction of the free layer and that of the pin layer causes a tunnel current flowing through the insulating layer. When the magnetization direction of the free layer is opposite to that of the pin layer, the current flowing through the insulating layer is smaller than when they coincide. That is, depending on the magnetization direction (the direction of electron spin) of the free layer, the resistance value of TMR elements in the direction of the lamination changes. Therefore, it is possible to construct a memory device in which the information of "0" or "1" is recorded into TMR elements with the magnetization direction of such free layers and then read out with a change in the resistance value of the TMR elements.

As will be appreciated by those skilled in the art, such a memory element MRAM using the TMR effect is of the non-volatile type and is also a static element, in which recorded contents are not destroyed by reading them. Further, the reading of information is only based on detecting a change in the resistance of TMR elements. Therefore, a basic cell for recording one bit requires only one selection transistor. From this fact, MRAM is capable of providing a packing density (i.e. low cost) as high as DRAM (Dynamic Random Access Memory) and implementing non-volatile memory devices such as EEPROM (electrical erasable Read Only Memory). In addition, it is possible for MRAM to implement a solid state memory element not requiring refresh operation same as SRAM (Static Random Access Memory). Further, MRAM has no limitation on the number of times that data can be re-written, as EEPROM has, and also have a higher rewrite speed as compared to EEPROM. Also, MRAM has a read speed and write speed as fast as DRAM. MRAM has many remarkable advantages as described above, it is expected that MRAM is a promising memory device replacing existing all solid state memory devices.

An access method for reading and writing from and to MRAM is dependent on the configuration of the memory cells and the placement of the bit lines and word lines. Hereinafter, for the cell configuration in which one memory cell is composed of one TMR element and one selection transistor, a reading and writing method will be described.

First, a typical structure of MRAM will be described. One end of a TMR element making up a memory cell is connected to the drain of a selection transistor, and the other end of the TMR element is connected to a bit line. The bit line is disposed above the TMR element in the cross-sectional view of the memory cell. The direction of extension of the bit line is referred to as a first direction. Since the memory cells are arranged in two dimensions with a matrix-like configuration in a memory array area, a plurality of memory cells (TMR elements) are connected to one bit line. This is similar to a typical DRAM. The drain of the selection transistor is usually connected to the TMR element through conductive plugs within a plurality of via holes or through holes and interconnect lines.

The source of the selection transistor is maintained at the ground potential, and the gate electrode of the selection transistor is formed as a portion of a word line extending in the second direction orthogonal to the first direction. The word line is made of a low resistive semiconductor material, such as doped polycrystalline silicon. Thus, the gate electrodes of the selection transistors arranged in the second direction forms a common word line. This is similar to DRAM.

Further, in the cross-sectional view of the TMR element, the word line is disposed extending in the second direction in a region below the TMR element.

The method for writing and reading will be described with respect to the memory cell having a structure as described above. First, the writing of information into the memory cell utilizes the bit line and word line. As described above, the bit lines and the write word lines are extending in different directions, and are disposed in a lattice-like arrangement with an orthogonal relationship. By selecting one bit line and one write word line a corresponding memory cell situated at the intersection of the two lines can be selected.

Currents in the predetermined directions are fed through the bit and write word lines selected. This makes the resultant of a magnetic filed created by a current flowing through the bit line and a magnetic filed created by a current flowing through the write word line. This composite magnetic field determines the magnetization direction of the free layer above-described. For example, the information corresponding to "1" makes the magnetization direction of the free layer opposite to that of the pin layer, thereby increasing the resistance value of the TMR element. On the other hand, the information corresponding to "0" makes the magnetization direction of the free layer coincident with that of the pin layer, thus decreasing the resistance value of the TMR element. Therein, the pin layer has been magnetized in a predetermined orientation, in advance.

In this way, in order to read information from the memory cells in which the information has been written, the bit lines and read word lines are used. In the same manner as described above, by selecting one bit line and one read word line, a memory cell situated at the intersection of the two lines is selected. By activating the gate electrode (read word line) of the selection transistor of the memory cell selected, the selection transistor is brought to the ON state, and thus a resistance value between the bit line and the ground is measured to detect the information (whether high resistance or low resistance). Thus, the information is read out.

As described above, an MRAM device has noticeable advantages over other memory devices, but also it has various problems in achieving high reliability and high integration into commercial application. For example, the problems include the reduction of variations in write magnetization and the stabilization of the pin layer. In particular, because such an MRAM device uses tunnel current, the insulating layers need to be made extremely thin, and as such improving the stability and uniformity of the insulating layers are significant challenges.

For example, as MRAM call size is reduced, the flow of current per unit area of the TMR cells becomes larger, resulting in a deterioration of the reliability. There is a minimum current capacity required to detect a change in the resistance of a TMR element, independently of the degree of reduced size of the cells. Therefore, as TMR cells become smaller, the density of current flowing through the cells becomes higher. This is one of factors for low reliability of the insulating layer in an extremely thin film.

There is another problem that the element resistances varies due to the manufacturing process variations in the insulating layers, pin layers, and free layers. Such variations in the element resistance due to the manufacturing processes cause variations in changed portions of resistance of the free layers dependent on the magnetization direction. This may prevent appropriate reading of information. That is, when variations in changed portions of the resistance values are large, it is difficult to detect a change in the resistance value dependent on the magnetization direction. Further, when memory cells become smaller, the change in the resistance values also becomes smaller, and thus the effect of the variations in the resistance values becomes larger. When a change in the resistance is small, the influence of the variations can not be neglected. In addition, for a characteristic of magneto resistive elements, a problem has been pointed out that a change in the resistance value dependent on the magnetization direction (MR ratio) is reduced when a high bias voltage is applied to the magneto resistive elements.

SUMMARY OF THE INVENTION

A non-volatile memory device according to one embodiment of the present invention includes a plurality of memory cells each comprising a magneto resistive element and a selection transistor, where the memory cells are arranged into a two dimensional array. A first interconnect line extends in a first direction of the memory array and functions as a gate electrode of a selection transistor included in each memory cell. A second interconnect line extends in the first direction of the memory array. A third interconnect line extends in a second direction. The magneto resistive element of at least some of the memory cells is sandwiched between the second and third interconnect lines.

DETAILED DESCRIPTION OF THE PREFERRED EMBODIMENTS

Figure 1:
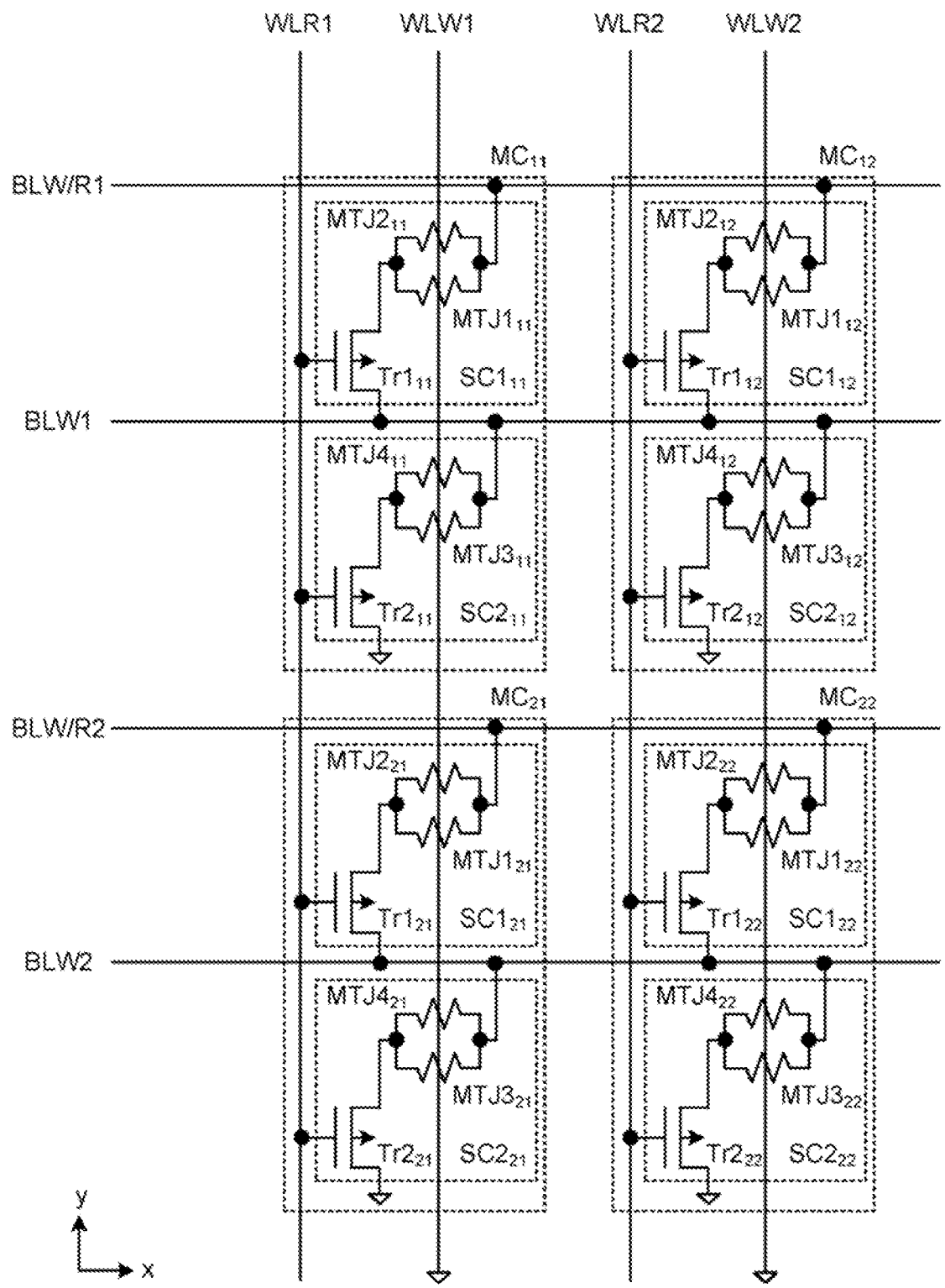
FIG. 1 shows a circuit diagram illustrating a portion of the memory cell area included in an example of a memory device according to a first embodiment (Embodiment 1) of the present invention.

Hereinafter, the embodiments of the invention will be described in detail with reference to the drawings, wherein like reference numerals, wherein the same element numbers refer to the same elements throughout all embodiments. However, the invention can be implemented in many different aspects, and thus the invention should not be construed as being limited to the contents described in the present embodiments.

FIG. 1 shows a circuit diagram illustrating a portion of the memory cell area included in an example of a memory device according to an embodiment of the invention. As shown in FIG. 1, the memory device according to the present embodiment has read word line WLR, write word line WLW, write/read bit line BLW/R, and write bit line BLW. The read word line WLR and write word line WLW are formed extending in the first direction (indicated as y direction in the figure). The write/read bit line BLW/R and write bit line BLW are formed extending in the second direction (indicated as x direction in the figure) nearly perpendicular to the first direction. Memory cells MC are disposed at the points of intersection of the word lines (read word line WLR and write word line WLW) and bit lines (write/read bit line BLW/R, write bit line BLW).

Here, in FIG. 1, the neighboring word lines in the first direction and the neighboring bit lines in the second line are indicated by giving each of the neighboring lines the same number. The memory cells MC disposed at the intersection of the word lines and bit lines are given each number of the bit lines and word lines as a subscript. That is, it is $MC_{11}$ that is disposed at the intersection of the read word line WLR1 and write word line WLW1 and the write/read bit line BLW/R1 and write bit line BLW1. Although only four memory cells $MC_{11}$, $MC_{12}$, $MC_{21}$, $MC_{22}$ are shown in FIG. 1, it is natural that further more memory cells can be connected. In the following description, the memory cell $MC_{11}$ will be taken as an illustration. Further, although each memory cell MC ($MC_{11}$, $MC_{12}$, $MC_{21}$, $MC_{22}$), and the components making up the MC (sub-cells SC1, SC2, magneto resistive elements MTJ1-4, selection transistors Tr1, Tr2, etc.) will be given the subscripts "11,", "12", "21", "22" in the FIGS. below, the subscripts will be omitted in the following description. When the subscripts of reference characters are omitted, the reference characters refer to the case of "11", such as $MC_{11}$, unless explicitly indicated. Other memory cell $MC_{22}$, $MC_{21}$, $MC_{12}$, and memory cells not shown are the same as in the case of the memory cell $MC_{11}$.

The memory cell MC includes sub-cells SC1 and SC2. The sub-cell SC1 includes magneto resistive elements MTJ1, MTJ2 and a selection transistor Tr1. The sub-cell SC2 includes magneto resistive elements MTJ3, MTJ4 and a selection transistor Tr2. The magneto resistive elements MTJ1-4 are the same as the element described in the paragraph of Background art. That is, the structure of the magneto resistive element has a sequential lamination of a ferromagnetic layer (pin layer) having a fixed magnetization direction disposed on the antiferromagnetic layer, an insulating layer, and an ferromagnetic layer (free layer) having variable magnetization direction. The selection transistor is an in-type MOSFET (Metal Oxide Semiconductor Field Effect Transistor), for example.

The magneto resistive elements MTJ1 and MTJ2 are connected to each other in parallel, and one end of the parallel combination is connected to the write/read bit line BLW/R, and the other end is connected to the drain of the selection transistor Tr1. The source of the selection transistor Tr1 is connected to the write bit line BLW. The magneto resistive elements MTJ3 and MTJ4 are connected to each other in parallel, and one end of the parallel combination is connected to the write bit line BLW, and the other end is connected to the drain of the selection transistor Tr2. The source of the selection transistor Tr2 is connected to the ground (earth). That is, the sub-cell SC1 and SC2 are connected in series between the write/read bit line BLW/R and the ground.

Figure 2A:
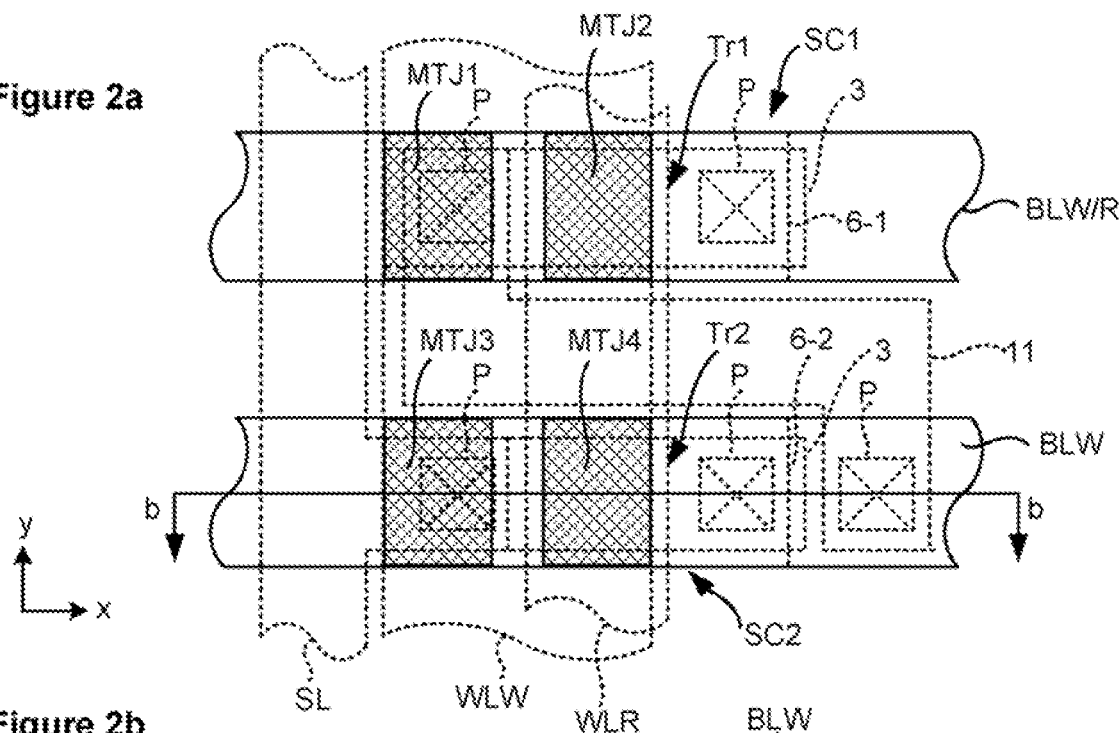
FIG. 2(a) shows a plan view of an example of a memory cell MC according to the Embodiment 1.
Figure 2B:
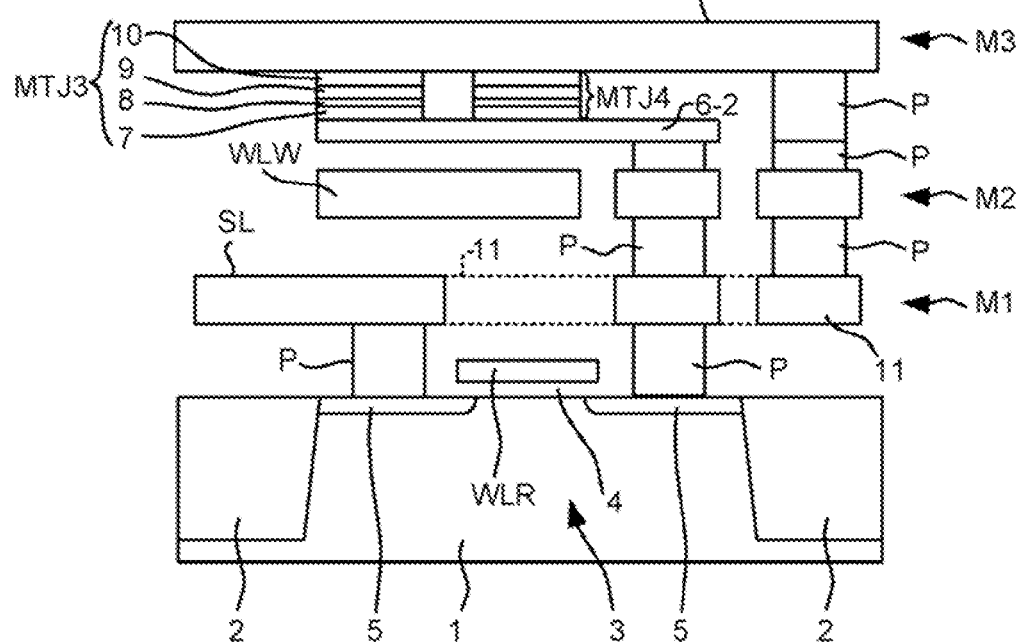
FIG. 2(b) shows a cross-sectional view of a memory cell MC according to the Embodiment 1.

FIG. 2(a) and FIG. 2(b) respectively show a plan view and cross-sectional view of an example of a memory cell according to the present embodiment. In FIG. 2, the adjacent memory cells are omitted. Further, the cross-sectional view of FIG. 2(b) is taken on the line b-b in FIG. 2(a).

The selection transistors Tr1 and Tr2 are disposed in an active region 3 surrounded by an element isolation region 2 which is formed in the top portion of a semiconductor substrate 1. The semiconductor substrate 1 is, for example, made of a silicon single crystal. When the selection transistors are of the n-channel type, the semiconductor substrate 1 may be doped to p type, or a p-well region may be formed in the substrate 1. The element isolation region 2 is, for example, made of silicon oxide. For example, after forming grooves on the surface of the semiconductor substrate 1, a silicon oxide layer is deposited thereon by CVD (Chemical Vapor Deposition) technique, and then the silicon oxide layer on all the region except within the groove region is removed by CMP (Chemical Mechanical Polishing) technique, thus forming the element isolation region. The active region 3, surrounded by the element isolation region 2, may be formed into a rectangular shape that is longer in the x direction. Although, one transistor is formed in one active region 3 in this embodiment, two transistors sharing a source region with one another may be formed in the center of one active region.

The read word line WLR is formed crossing over the active region 3 in the top potion of the semiconductor substrate 1. The read word line WLR functions as the gate electrodes of the selection transistors Tr1 and Tr2. Further, a gate insulating film 4 is formed between the gate electrode (read word line WLR) and the active region 3. A semiconductor region 5 serving as a source or drain is formed in the vicinity of the surface of the active region 3 on both sides of the gate electrode. The read word line WLR functioning as the gate electrodes is made of polycrystalline silicon film of lowered resistance. For this purpose, the polycrystalline silicon is highly doped, for example, with phosphorus or boron so as to lower its resistance. In addition, in order to lower the resistance of the polycrystalline silicon film, the formation of metal-silicide on the film surface may be used. Alternatively, a metal layer such as tungsten may be formed on the intermediate layer intervening between the metal layer and the polycrystalline silicon film. The gate insulating film 4 is a silicon oxide film formed by the thermal oxidation method or the thermal CVD method or other methods. When the selection transistor is of the n-channel type, the semiconductor region 5 is doped with an n-type impurity, such as phosphorus. It is natural that the selection transistor may be of the p-channel type. In this case, the semiconductor region 5 is doped with a p-type impurity, such as boron. In order to lower the resistance of the surface potion of the semiconductor region 5 or to decrease the contact resistance, metal-silicide may be formed on the surface potion of the semiconductor region 5. Here, the semiconductor region 5 may be self-aligned by using the gate electrode as the mask.

Above the semiconductor region 5, a first layer of a metal interconnect line (M1) is formed connecting to the region 5 through a plug P. A source line (SL), maintained at the ground potential, is formed in a portion of M1 (above the selection transistor 2). The source line SL is formed extending in the y direction. Further, M1 includes a local interconnect line 11 for connecting the source of the selection transistor Tr1 and the write bit line BLW. A so-called Damascene process may be used for forming the plug P and the interconnect line M1. That is, after the deposition of an interlayer insulating film such as a silicon oxide film, the surface of the film is made planar, for example, by a CMP technique, and then contact holes or interconnection grooves are formed therein, for example, by a dry etching technique. Thereafter, a conductive material (e.g. tungsten, copper, aluminum, etc.) is deposited thereon, and then the extra conductive material on the surface of the interlayer insulating film in all the regions except within the contact holes or interconnection grooves are removed, for example, by a CMP technique. These Damascene processes may be applied to the formation of interconnect lines and plugs described below. In the later description, the explanation of Damascene process will be omitted.

Above the first layer of a metal interconnect line M1, a second layer of a metal interconnect line M2 is formed connecting to the line M1 through a plug P. M2 includes the write word line WLW. The write word line WLW is formed extending in the y-direction in such a manner that it may situated under the magneto resistive elements MTJ1, MTJ2, MTJ3, and MTJ4.

The magneto resistive elements MTJ1-4 are formed above the second layer of a metal interconnect line. As shown in the figure, MTJ1-4 are formed in the same layer. Here, the free layers 7 of the MTJ1 and MTJ2 are formed in contact with the interconnect line 6-1, and the free layers 7 of the MTJ3 and MTJ4 are formed in contact with the interconnect line 6-2. The interconnect lines 6-1, 6-2 are respectively connected to the drains of the selection transistors Tr1, Tr2 through the plugs P, M2, and M1. The antiferromagnetic layers 10 of MTJ1 and MTJ2 and the antiferromagnetic layers 10 of MTJ3 and MTJ4 are connected to the write/read bit line BLW/R and the write bit line BLW, respectively. That is, the magneto resistive elements MTJ1 and MTJ2 are connected in parallel, and also the magneto resistive elements MTJ3 and MTJ4 are connected in parallel. MTJ1-4 each are composed of the free layer 7 of a ferromagnetic material, insulating layer 8, pin layer 9 of a ferromagnetic material, and antiferromagnetic layer 10, as described above. Appropriate intermediate layers may be provided in each of these layers, or the top/bottom end layer. For example, a Co film may be used for the free layer 7 and the pin layer 9, and, for example, a FeMn film may be used for the antiferromagnetic layer 10. A silicon oxide film or alumina ($Al_2O_3$) film may be used for the insulating layer 8. These films may be produced with a sputtering technique or CVD technique. By the way, the lamination of the above-described MTJ may be done the other way around. That is, although the lamination order of this embodiment is, from the top layer, the antiferromagnetic layer, pin layer, insulating layer, and then free layer, in contrast, the free layer, insulating layer, pin layer and then antiferromagnetic layer may be sequentially laminated from the top layer.

A third layer of a metal interconnect line M3 is formed on the magneto resistive elements MTJ1-4. M3 includes the write/read bit line BLW/R and write bit line BLW. The write/read bit line BLW/R is formed extending in the x direction such that it may be situated on MTJ1 and MTJ2 to be in contact with them. The write bit line BLW is formed extending in the x direction such that it may be situated on MTJ3 and MTJ4 to be in contact with them. Further, the write bit line BLW is connected to the plug P, which is connected to the source of the selection transistor Tr1, as described above.

According to the device structure as described above, a memory cell MC having the circuit shown in FIG. 1 can be implemented. However, the device structure shown in FIG. 2 is strictly for an illustration, it is possible to implement the circuit shown in FIG. 1 with other structures. Furthermore, it is natural that the above-described memory cells MC can make up a memory array when a plurality of the same memory cells are arranged in the x and y directions, respectively.

Next, a method for writing and reading one-bit of information to and from the above-described memory cell MC will be described. When data is written into the memory cell MC, the Tr1 and Tr2 is brought to the OFF state and currents are fed through the write/read bit line BLW/R and write bit line BLW and the write word line WLW. The resultant of the magnetic fields created by these currents determines the magnetization direction of the free layer 7. The magnetization direction records one bit information of "1" or "0". Here, it is natural that the write/read bit line BLW/R and write bit line BLW are fed with currents in the same orientation.

In order to read out information recorded in the memory cell MC, Tr1 and Tr2 are brought to the ON state (when the selection transistor is of the n-channel type, the read word like WLR is brought to a HIGH level of voltage), and a predetermined current is fed through the write/read bit line BLW/R. Then, the voltage of the write/read bit line BLW/R is measured. If the magnetization direction of the free layer coincides with that of the pin layer, a tunnel current flows through the insulating layer. On the other hand, if these magnetization directions do not coincide, the tunnel current becomes smaller than the current when they coincide. As a result, the resistance value of the magneto resistive element MTJ changes by the change of magnetization direction of the free layer, so that the voltage of the write/read bit line BLW/R also changes. Thereby, it is possible to determine whether the information recorded is "1" or "0". In this case, the selection transistors for all the memory cells except a cell associated with the reading are changed to the OFF state.

With the memory cell according to present embodiment, the four magneto resistive elements MTJ1-4 together record one bit of information. Therein, the two elements respectively are connected in parallel, and further the two parallel combinations are connected in series. Therefore, the current density of the current flowing through each element is reduced to ½ of the current density when one magneto resistive element records one bit. Consequently, it is possible to suppress a reduction in the reliability of magneto resistive elements, such as the breakage caused by current.

Further, provided that the on-resistance of the selection transistors is negligible, a change in the resistance value of the whole memory cell can be expressed as follows. That is, it is assumed that the resistance values of MTJ1-4 are R and a change in the resistance values is r2. Here, assume that one MTJ of the four elements offers a smaller change r1 in its resistance value (r1<r2). Such a smaller change in the resistance value is problematic in the conventional art.

It is assumed that the resistance value of the whole memory cell is Rtotal, Rtotal can be expressed in the following equation.

$$Rtotal = (R + r2)\{1 - Dr/(4R + 4r2 - 2Dr)\} \pounds (R + r2)\{1 - Dr/(4R + 4r2)\}$$
$$= R + r2 - Dr/4$$

Wherein r1=r2−Dr and 4R+4r2>>2Dr are assumed. That is, Dr=r2−r1 expresses an influence due to a change in the resistance value when one bit of information is recorded with one magneto resistive element and the one magneto resistive element has only the smaller change r1 in its resistance value. Therefore, this embodiment can reduce the influence due to the smaller change to ¼ of the influence when one bit is recorded with one magneto resistive element.

Thus, according to the memory cell of the present embodiment, it is possible to suppress the influence due to an increase in current density and reduction in the resistance-value change which are caused by high integration. Therefore, the reliability of the recording by memory device can be improved. Further, the bias-voltage dependence of the MR ration of MTJ can be reduced. It is to be understood that the arrangement of the above-described memory cells is a kind of redundant arrangement and other kinds of redundant arrangement can be employed. Further, the above-described embodiment illustrated an arrangement of the magneto resistive elements comprising two elements in parallel and two elements in series (2'2), but 3'3 or more magneto resistive elements may be arranged in parallel and in series. In this case, the current density can be reduced to be equal to or less than ⅓ of the current density when one bit is recorded with one element, and an influence due to a decrease in the resistance-value change can be reduced to be equal to or less than ⅑ of the influence when one bit is recorded with one element. Furthermore, the arrangement of an equal number of magneto resistive elements, such as 2'2 and 3'3, but parallel and serial arrangements consisting of different numbers of the elements, such as 2'3, 3'4, and 2'4, are also possible. Although the use of the redundant arrangement as described above has a disadvantage of an increased cell area, the element area is substantially only 2 times larger than the minimum configuration of 1MTJ+1Tr, as shown in the plan view of FIG. 2(a). Therefore, considering the effect of improvements in reliability by redundancy, sufficient advantage will be obtained to fully cancel the above-described disadvantage. When high packing density is not required, it is possible to benefit from the advantages of the present embodiment as is.

Figure 3:
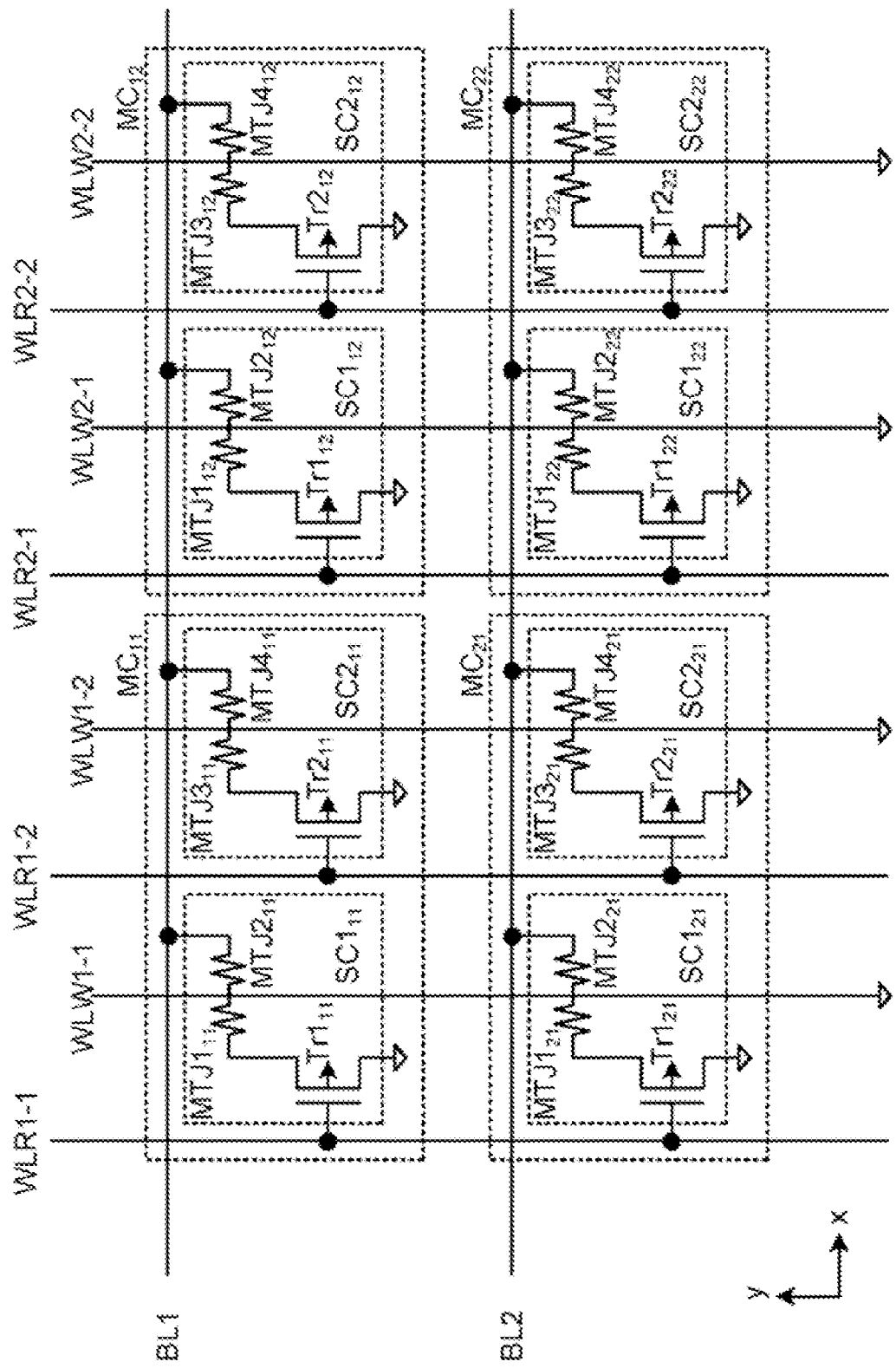
FIG. 3 shows a circuit diagram illustrating a potion of the memory cell area included in an example of a memory device according to another embodiment (Embodiment 2) of the present invention.

FIG. 3 shows a circuit diagram illustrating a potion of the memory cell area included in an example of a memory device according to another embodiment of the invention. As shown in FIG. 3, the memory device according to the present embodiment has read word lines WLR-1, WLR-2, write word lines WLW-1, WLW-2, and bit line BL. The word line (read word lines WLR-1, WLR-2, and write word lines WLW-1, WLW-2) is formed extending in a first direction (indicated as y direction in the figure). The bit line BL is formed extending in a second direction (indicated as x direction in the figure) nearly perpendicular to the first direction. The memory cells MC are disposed at the intersections of the word lines and the bit line BL. By the way, the numbers given to the bit lines and word lines and the subscripts given to the memory cells and others are in accordance with the same rule as in the embodiment 1.

The memory cell MC includes sub-cells SC1 and SC2. The sub-cell SC1 includes magneto resistive elements MTJ1, MTJ2 and a selection transistor Tr1. The sub-cell SC2 includes magneto resistive elements MTJ3, MTJ4 and a selection transistor Tr2. The magneto resistive elements MTJ1-4 and the selection transistors Tr1, Tr2 are the same as in the embodiment 1.

The magneto resistive elements MTJ1 and MTJ2 are connected to each other in series and one end of the serial combination is connected to the bit line BL. The other end is connected to the drain of the selection transistor Tr1. The source of the selection transistor Tr1 is connected to the ground (earth). Similarly, the magneto resistive elements MTJ3 and MTJ4 are connected to each other in series and one end of the serial connection is connected to the bit line BL. The other end is connected to the drain of the selection transistor Tr2. The source of the selection transistor Tr2 is connected to the ground (earth). That is, the sub-cell SC1 and SC2 is connected in parallel between the bit line BL and the ground.

Figure 4:
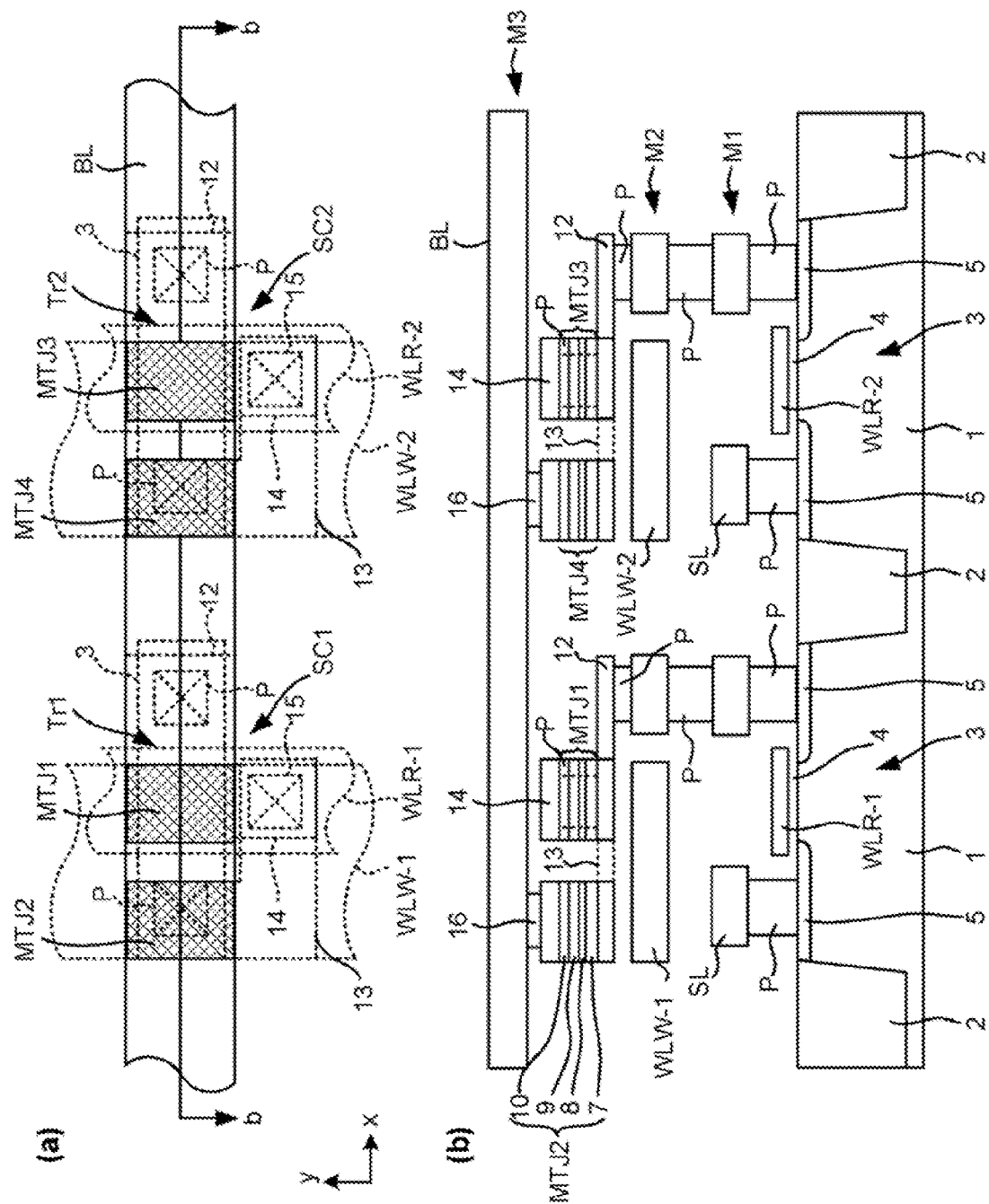
FIG. 4(a) shows a plan view of an example of a memory cell MC according to the Embodiment 2.
FIG. 4(b) shows a cross-sectional view of a memory cell MC according to the Embodiment 2.

FIGS. 4(a) and (b) respectively show a plan view and a cross-sectional view illustrating an example of the memory cell MC according to the present embodiment. In FIG. 4, the neighboring cells are omitted. Further, the cross-sectional view of FIG. 4(b) shows a linear section taken on the line b-b of FIG. 4(a).

The descriptions relating to a semiconductor substrate 1, element isolation region 2, active region 3, selection transistors Tr1, Tr2, gate-insulating film 4, semiconductor region 5 and the materials of the gate electrodes, and the constituents of a first metal interconnect line M1, second metal interconnect line M2, third metal interconnect line M3, interlayer insulating material and magneto resistive elements MTJ are the same as in the embodiment 1. Therefore, a detailed explanation about them will be omitted.

According to the present embodiment, the sub-cells SC1 and SC2 are disposed adjacent to each other in the x direction. That is, one bit line BL is formed extending in the x direction and two read word lines WLR-1, WLR-2 are formed extending in the y direction. WLR-1 and WLR-2 are disposed adjacent to each other in the x direction. The read word lines WLR-1, WLR-2 function as the gate electrodes of the selection transistors Tr1, Tr2, respectively.

Further, according to the present embodiment, the magneto resistive elements MTJ1 and MTJ2 are connected in series. That is, a local interconnect line 12, connected to a plug extending up from the drain of the selection transistor Tr1, is disposed on the bottom of the MTJ2. A local interconnect line 14 disposed on the top of MTJ2 and a local interconnect line 13 disposed on the bottom of MTJ1 are connected through a plug 15. Then, the top of MTJ1 is connected to the bit line BL through a plug 16. The magneto resistive elements MTJ3 and MTJ4 are also connected in series. The connection of them is made in the same manner as described above.

A memory cell MC having the circuit shown in FIG. 3 is implemented by the device structure as described above. However, the device structure shown in FIG. 4 is strictly for an illustration, and therefore other structures may implement the circuit of FIG. 3. Furthermore, it is natural that the above-described memory cell can make up memory array when a plurality of the same memory cells are respectively arranged in the x and y directions.

Next, a method for writing and reading one bit of information to and from the above-described memory cell will be described. When data is written into the memory cell MC, Tr1 and Tr2 are brought to the OFF state, and currents are fed through the bit line BL and the write word lines WLW-1, WLW-2. The resultant of the magnetic fields created by these currents determines the magnetization direction of the free layer 7. One bit information of "1" or "0" is recorded depending on the magnetization direction. By the way, it is natural that the currents in the same direction are fed through the write word lines WLW-1 and WLW-2.

In order to read the information recorded in the memory cell MC, Tr1 and Tr2 are brought to the ON state (if the selection transistor is of the n-channel type, the read word lines WLR-1, WLR-2 are brought to the HIGH level of voltage), and a current is fed through the bit line BL. Then, the voltage of the bit line is measured. If the magnetization directions of the free layer and pin layer coincide, a tunnel current flows through the insulating layer. When those directions do not coincide, the tunnel current is reduced as compared with the current when they coincide. Therefore, the resistance value of the magneto resistive element MTJ changes by the change of magnetization direction of the free layer, so that the voltage of the bit line also BL changes. This can determine whether the information recorded is "1" or "0". Here, the selection transistors for all the cells except memory a cell associated with the reading are brought to the OFF state.

With the memory cell according to the present embodiment, similarly to the embodiment 1, the four magneto resistive elements MTJ1-4 together record one bit of information. Therein, two magneto resistive elements are connected in series and the two serial combinations are connected in parallel, provided that the on resistance of the selection transistors can be neglected. Therefore, the current density of the current flowing through each of the magneto resistive elements is ½ of the current density when one magneto resistive element records one bit. Thus, the reduction in the reliability of the magneto resistive elements, such as damages caused by current, can be suppressed. Further, an influence due to the reduction in the resistance-value change can be suppressed to ¼ in the same manner as in the embodiment 1. This embodiment is similar to the embodiment 1 in that the arrangement of the magneto resistive elements is not limited to 2'2, and in that the cell area is substantially only 2 times larger than the cell area of the configuration of 1 MTJ+1 Tr, and also in that the bias-voltage dependence of the MR ratio can be relaxed.

Figure 5:
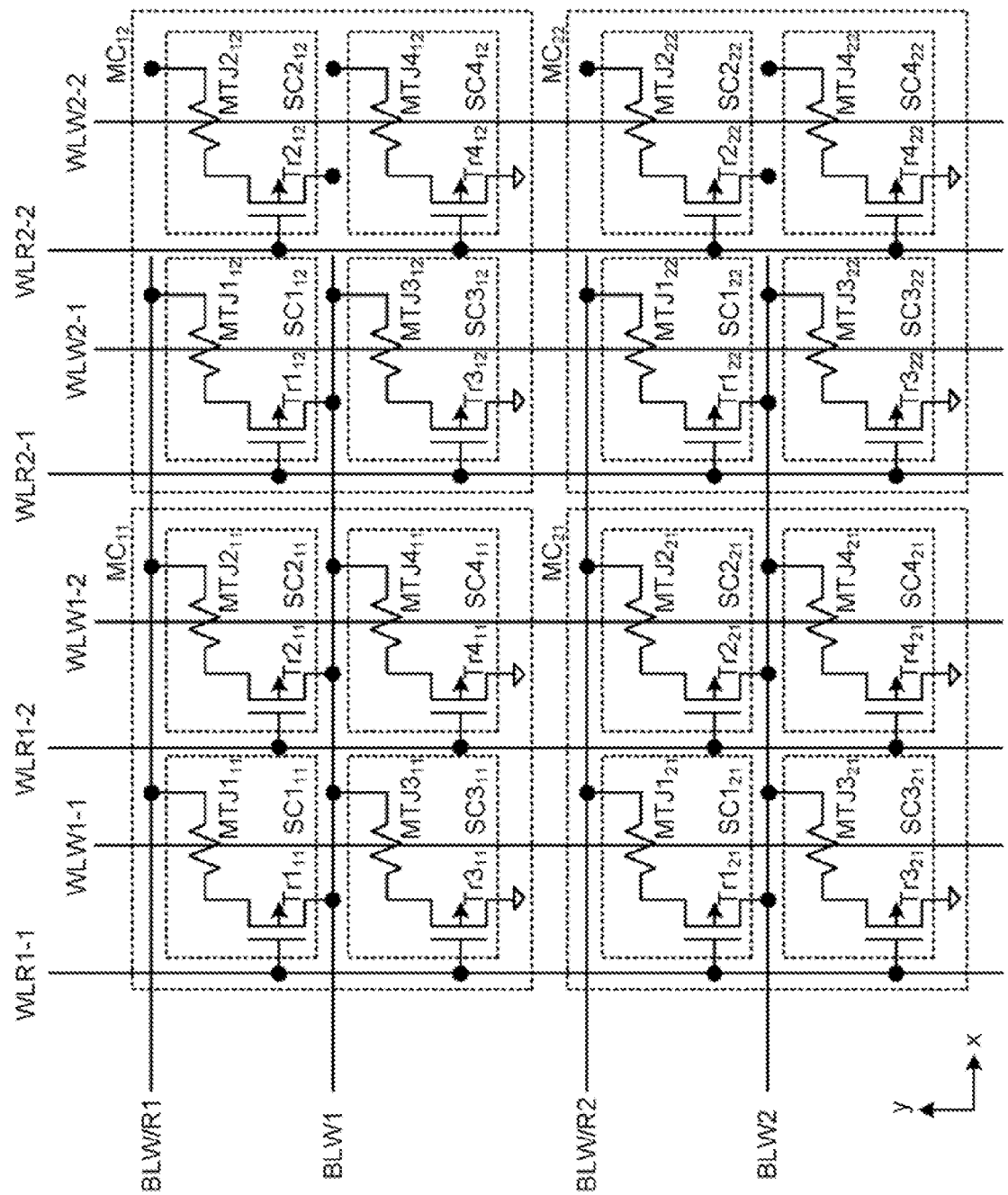
FIG. 5 shows a circuit diagram illustrating a potion of the memory cell area included in an example of a memory device according to still another embodiment (Embodiment 3) of the present invention.

FIG. 5 is a circuit diagram illustrating a portion of the memory cell area included in an example of a memory device according to still another embodiment of the invention. As shown in FIG. 5, the memory cell according to the present embodiment has read word lines WLR-1, WLR-2, write word line WLW-1, WLW-2, write/read bit line BLW/R, and write bit line BLW. The word lines (read word lines WLR-1, WLR-2, write word lines WLW-1, WLW-2) are formed extending in a first direction (indicated as y direction in the figure). The bit line (write/read bit lines BLW/R and write bit line BLW) is formed extending in a second direction (indicated as x direction in the figure) nearly perpendicular to the first direction. At the intersections of the word lines and the bit lines BL, the memory cells MC are disposed. In FIG. 5, the numbers given to the bit lines and word lines and the subscripts given to the memory cells are given in accordance with the same rule as in the embodiment 1.

The memory cell MC includes four sub-cells SC1, SC2, SC3, and SC4. The sub-cell SC1 includes a magneto resistive element MTJ1 and a selection transistor Tr1. The sub-cell SC2 includes a magneto resistive element MTJ2 and a selection transistor Tr2. The sub-cell SC3 includes a magneto resistive element MTJ3 and a selection transistor Tr3. The sub-cell SC4 includes a magneto resistive element MTJ4 and a selection transistor Tr4. The magneto resistive element MTJ1-4 and the selection transistor Tr1-4 are the same as those included in the embodiment 1.

One of the ends of the magneto resistive elements MTJ1 and MTJ2 is connected to the write/read bit line BLW/R. The other end is connected to the drains of the selection transistors Tr1 and Tr2, respectively. The sources of the selection transistors Tr1 and Tr2 are connected to the bit line BLW. One ends of the magneto resistive elements MTJ3 and MTJ4 are connected to the write bit line BLW. The other ends of them are connected to the drains of the selection transistors Tr3 and Tr4, respectively. The sources of the selection transistors Tr3 and Tr4 are connected to the ground (earth). That is , the sub-cells SC1 and SC2, and the sub-cells SC3 and SC4 are connected in parallel, respectively. The parallel combination of SC1 and SC2 is connected in series with the parallel combination of SC3 and SC4 between the write/read bit line BLW/R and the ground.

Since a device structure for implementing such a combination of the sub-cells can be achieved by integrating the MTJ structures shown in FIG. 2 into one, the detailed explanation about the device structure will be omitted. However, such a device structure is strictly for an illustration, and therefore other structures may implement the circuit of FIG. 5. Furthermore, it is natural that the above-described memory cell MC can make up a memory array when a plurality of the same memory cells are respectively arranged in the x and y directions.

Next, a method for writing and reading one bit of information to and from the above-described memory cell will be described. When data is written into the memory cell MC, Tr1-4 are brought to the OFF state, and currents are fed through the write/read bit line BLW/R and write bit line BLW and the write word lines WLW-1, WLW-2, respectively. The resultant of the magnetic fields created by these currents determines the magnetization direction of the free layer 7. Thus, one bit information of "1" or "0" is recorded depending on the magnetization direction. Therein, it is natural that the currents fed through write/read bit line BLW-R and write bit line BLW, and through write word lines WLW-1 and WLW-2 are in the same orientation.

In order to read the information recorded in the memory cell, Tr1-4 are brought to the ON state (if the selection transistor is on the n-channel type, the read word lines WLR-1, WLR-2 are made to the HIGH level of voltage), and a predetermined current is fed through the write/read bit line BLW/R. Then, the voltage of the write/read bit line is measured. If the magnetization direction of the free layer coincides with that of the pin layer, a tunnel current flows through the insulating layer. On the other hand, if the magnetization direction of the free layer do not coincide with that of the pin layer, the tunnel current is reduced as compared with the current when they coincide. In this way, the resistance value of the magneto resistive element MTJ changes by the change of magnetization direction of the free layer. Thereby, the voltage of the bit line BL changes. This enables to determine whether the information recorded is "1" or "0". In this case, the selection transistors for all the memory cells except a cell associated with the reading are brought to the OFF state.

With the memory cell according to the present embodiment, similarly to the embodiment 1, the four magneto resistance elements MTJ1-4 together record one bit of information. The arrangement of the four elements is such that two magneto resistive elements are respectively connected in parallel and then the two parallel combinations are connected in series, provided that the on resistance of the selection transistors can be neglected. This arrangement reduces the current density of a current flowing through one magneto resistive element to ½ of the current density when one magneto resistive element is used to record one bit. This can suppress the deterioration in the reliability of the magneto resistive elements, such as the damage of the elements caused by current. Further, similarly to the embodiment 1, this arrangement reduces the influence due to the reduction in the resistance-value of the whole memory cell to ¼ of the influence when on magneto resistive element is used to record one bit. This embodiment is similar to the embodiment 1 in that the arrangement of the magneto resistive elements is not limited to 2'2, and in that the bias-voltage dependence of the MR ratio can be relaxed.

Figure 6:
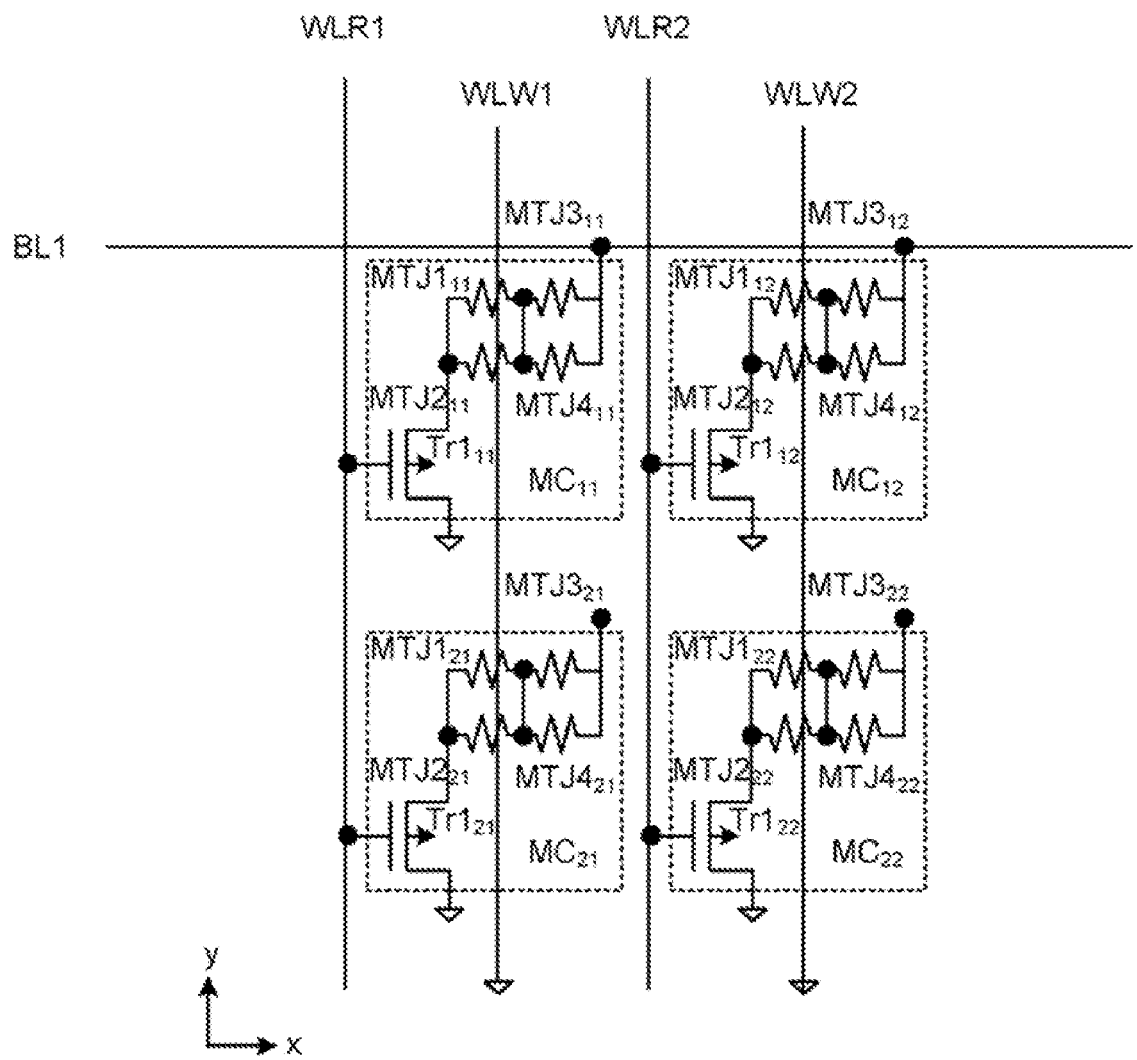
FIG. 6 shows a circuit diagram illustrating a potion of the memory cell area included in a example of a memory device according to further another embodiment (Embodiment 4) of the present invention.

FIG. 6 shows a circuit diagram illustrating a potion of the memory cell area included in an example of a memory device according to a further embodiment of the invention. As shown in FIG. 6, the memory device according to the present embodiment has read word line WLR, write word line WLW, and bit line BL. The word line (read word line WLR, write word line WLW) is formed extending in a first direction (indicated as y direction in the figure). The bit line BL is formed extending in the second direction (indicated as x direction in the figure) nearly perpendicular to the first direction. The memory cells MC are disposed at the intersections of the word lines and the bit lines. By the way, the number given to the bit lines and word lines and the subscripts given to the memory cells are given according to the same rule as in the embodiment 1.

The memory cell MC includes magneto resistive elements MTJ1, MTJ2, MTJ3, and MTJ4 and a selection transistor Tr1. The magneto resistive elements MTJ1-4 and the selection transistor Tr1 are the same as those of the embodiment 1.

The magneto resistive elements MTJ1 and MTJ2 are connected to each other in parallel and also the magneto resistive elements MTJ3 and MTJ4 are connected to each other in parallel. The parallel combination of the elements MTJ1 and MTJ2 are connected in series with the parallel combination of the elements MTJ3 and MTJ4. One end of the parallel and serially connected elements MTJ1-4 is connected to the bit line BL and the other end is connected to the drain of the selection transistor Tr1. The source of the selection transistor Tr1 is connected to the ground.

Figure 7:
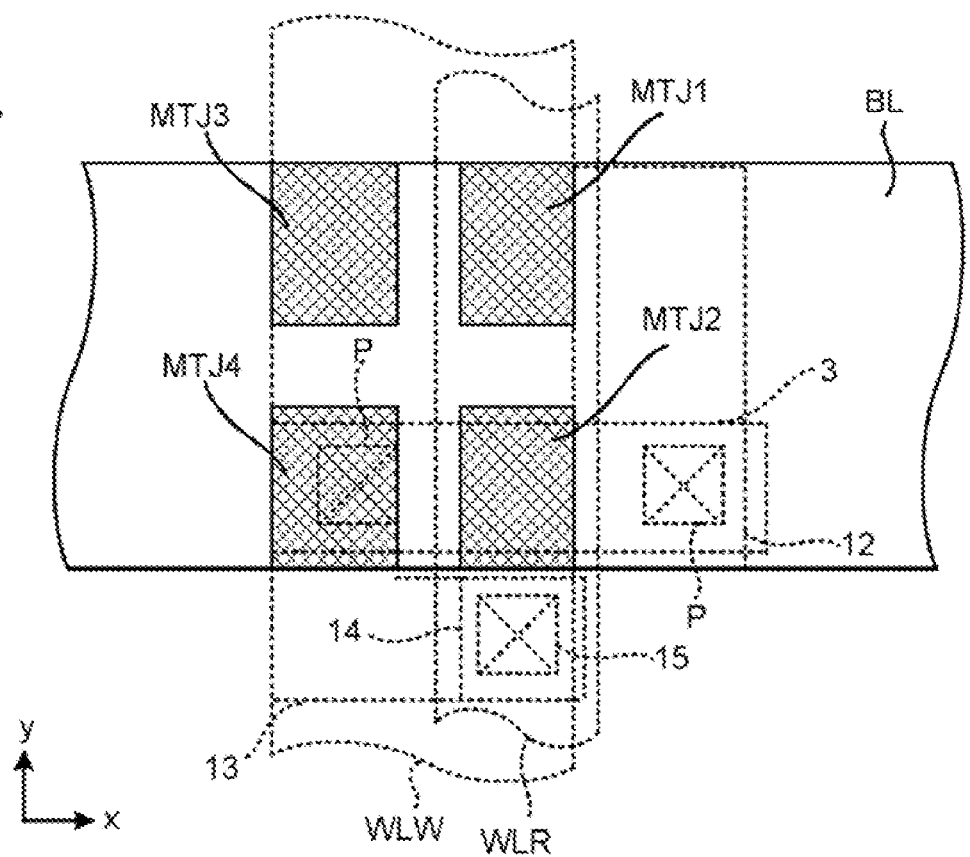
FIG. 7 shows a plan view of an example of a memory cell MC according to the Embodiment 4.

FIG. 7 is a plan view illustrating an example of a memory cell according to the present embodiment. MTJ1 and MTJ2 on one hand and MTJ3 and MTJ4 on the other hand are connected in parallel through the local interconnect lines disposed respectively at the tops and bottoms of the elements. Further, similar to the embodiment 2, the serial connection is implemented with local interconnect lines 13, 14 and a plug 15.

Such a device structure can implement the memory cell MC comprising the circuit shown in FIG. 6. However, the device structure shown in FIG. 7 is strictly for an illustration, and therefore other structures can implement the circuit of FIG. 6. Furthermore, it is natural that the above-described memory cell can make up a memory array when a plurality of the same memory cells are respectively arranged in the x and y directions.

Next, a method for writing and reading one bit of information to and from the above-described memory cell will be described. When data is written into the memory cell MC, the transistor Tr1 is brought to the OFF state, and currents are fed through the bit line BL and the word line WLW. The resultant of the magnetic fields created by these currents determines the magnetization direction of the free layer 7.

In order to read the information recorded in the memory cell, Tr1 is brought to the ON state (if the selection transistor is on the n-channel type, the read word line WLR is brought to the HIGH level of voltage), and a predetermined current is fed through the bit line BL. Then, the voltage of the bit line is measured. When the magnetization direction of the free layer coincides with that of the pin layer, a tunnel current flows through the insulating layer. On the other hand, if the magnetization directions of these layers do not coincide, the tunnel current is smaller than that when they coincide. In this way, the resistance value of the magneto resistive element changes by the change of magnetization direction of the free layer. Thereby, the voltage of the bit line BL changes. As a result, it is possible to determine whether the information recorded is "1" or "0". In this case, the selection transistors for all the memory cells except a cell associated with the reading are brought to the OFF state.

With the memory cell according to the present embodiment, similarly to the embodiment 1, the four magneto resistive elements MTJ1-4 together records one bit of information. The arrangement of the four elements is such that two magneto resistive elements are respectively connected in parallel and then the two parallel combination are connected in series, provided that the on resistance of the selection transistors can be neglected. This arrangement reduces the current density of a current flowing through one magneto resistive element to ½ of the current density when one magneto resistive element records one bit. This can suppress the deterioration in the reliability of the magneto resistive elements, such as the damage of the elements caused by current. Further, similarly to the embodiment 1, this arrangement reduces the influence due to the reduction in the resistance-value change of the whole memory cell to ¼ of the influence when one magneto resistive element records one bit. This embodiment is similar to the embodiment 1 in that the arrangement of the magneto resistive elements is not limited to 2'2, and in that the cell area is substantially only 2 times larger than the cell area of the configuration of 1MTJ+1Tr, and in that the bias-voltage dependence of the MR ratio can be relaxed.

Figure 8:
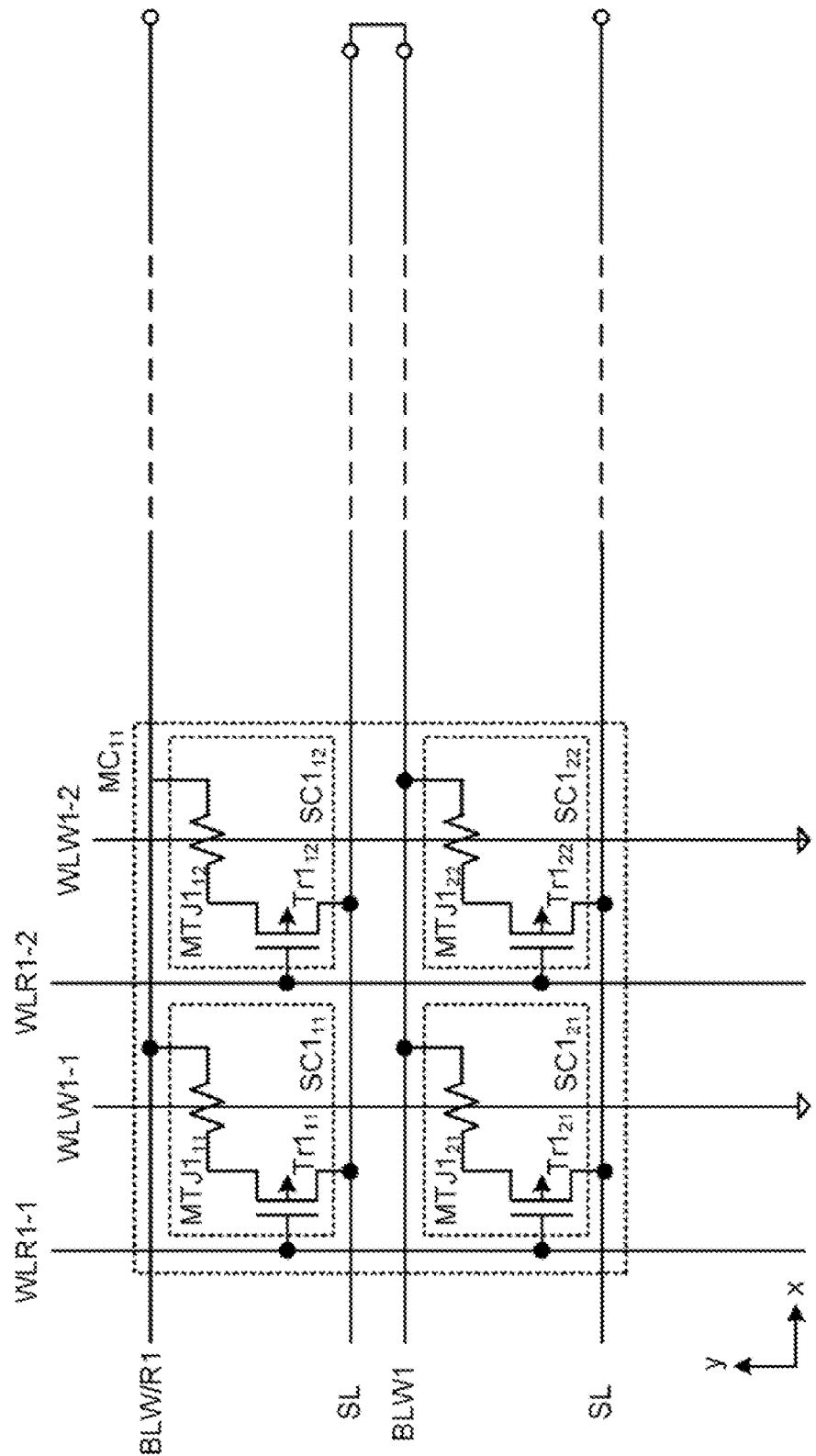
FIG. 8 shows a circuit diagram illustrating a potion of the memory cell area included in an example of a memory device according to still further another embodiment (Embodiment 5) of the present invention.

FIG. 8 shows a circuit diagram illustrating a portion of the memory cell area included in an example of a memory device according to a still further another embodiment of the invention. As shown in FIG. 8, the memory device according to the present embodiment has read word lines WLR-1, WLR-2, write word lines WLW-1, WLW-2, write/read bit line BLW/R and write bit line BLW. The word line (read word lines WLR-1, WLR-2, and write word lines WLW-1, WLW-2) is formed extending in a first direction (indicated as y direction in the figure). The bit line (write/read bit line BLW/R, and write bit line BLW) is formed extending in the second direction (indicated as x direction in the figure) nearly perpendicular to the first direction. According to the embodiment, source line SL maintained at the ground potential are formed extending in the same x direction as the bit line. The memory cells MC are disposed at the intersections of the word lines and the bit lines BL. By the way, the numbers given to the bit lines and word lines and the subscripts given to the memory cells MC are given according to the same rule as in the embodiment 1.

The memory cell MC is composed of four sub-cells. Each sub-cell SC1 has a magneto resistive element MTJ1 and a selection transistor Tr1. One end of the MTJ1 is connected to the write/read bit line BLW/R or to the write bit line BLW, and the other end is connected to the drain of the selection transistor. The source of the selection transistor Tr1 is connected to source line SL.

That is, the sub-cell according to the embodiment, by itself, can function as a memory cell having the configuration of 1MTJ+1Tr. However, according to the present embodiment, the source line SL and the write bit line BLW are connected in the area of peripheral circuits (see A portion), and the resistance value between the write/read bit line BLW/R and source line SL is measured in reading. That is, in order to read the information recorded in the memory cell, $Tr1_{11}$-$Tr1_{12}$ are brought to the ON state (if the selection transistor is on the n-channel type, the read word lines WLR-1, WLR-2 are brought to the HIGH level of voltage), and a predetermined current is fed through the write/read bit line BLW/R. Then, the voltage between the write/read bit line BLW/R and the source line SL is measured. When data is written into the memory cell, $Tr1_{21}$-$Tr1_{22}$ are brought to the OFF state, and currents are fed through the write/read bit line BLW/R and write bit line BLW and also the write word lines WLW-1, WLW-2. Then, the resultant of the magnetic fields created by these currents determines the magnetization direction of the free layer 7.

With the memory cell according to the present embodiment, similarly to the embodiment 1, the four magneto resistive elements $MTJ1_{21}$-$MTJ1_{22}$ together records one bit of information. The arrangement of the four elements is such that two magneto resistive elements are respectively connected in parallel and then the two parallel combinations are connected in series, provided that the on-resistance of the selection transistors can be neglected. This arrangement reduces the current density of a current flowing through one magneto resistive element to ½ of the current density when one magneto resistive element records one bit. This can suppress the deterioration in the reliability of the magneto resistive elements, such as the damage of the elements caused by current. Further, similarly to the embodiment 1, this arrangement reduces the influence due to the reduction in the resistance-value change of the whole memory cell to ¼ of the influence when one magneto resistive element records one bit. This embodiment is similar to the embodiment 1 in that the arrangement of the magneto resistive elements is not limited to 2'2, and in that the bias-voltage dependence of the MR ratio can be relaxed. Furthermore, according to the embodiment, the sub-cell by itself can function as a memory cell having the configuration of 1MTJ+1Tr. Therefore, when the reliability of the elements MTJ has been improved or the elements TMJ have no serious problem of the reliability, the memory cells according to this embodiment can be changed into to the memory cells of the configuration of 1MTJ+1Tr only by simple modifying the peripheral circuit, without design changes of the memory cells.

The invention achieved by the inventor has been explained above based on the embodiments of the invention. The present invention is not limited to the above-described embodiments, but is capable of various modifications without departing from the scope of its gist. For example, the number of the parallel or serially connected magneto resistive elements was equal to or more than 2 in the above-described embodiments, but the number of either of the parallel and serially connected elements may be one. That is, the serially and parallel arranged combinations such as 1'2, 2'1, or 1'(more than 3), (more than 3)'1, and the like may be possible. In these cases, the use of the serially connected elements of more than 2 (including no parallel connection) cannot provide the advantage of reducing current density, but can reduce the influence of the resistance-value change to smaller than ½ of the influence when a cell has a single element. Further, when the parallel connected elements of more than 2 (including no serial connection) is used, the resistance value of the whole of magneto resistive elements is reduced, but the current density and the influence of the resistance-value change are also reduced to ½ or less as compared to a single element cell.

The typical advantages provided by the inventions disclosed by this application are as follows; the reliability of recording with MRAM can improved, the reading of information with a high degree of reliability can be implemented provided that the resistance values of the magneto resistive elements vary in a certain range, and the bias-voltage dependence of the MR ratio can be relaxed.

What is claimed is:
1. A non-volatile memory device, comprising:
a plurality of memory cells each comprising a magneto resistive element and a selection transistor;
wherein at least some of the memory cells are arranged into a two dimensional array;
a first interconnect line extending in a first direction of the memory array and functioning as a gate electrode of a selection transistor included in each memory cell;
a second interconnect line extending in the first direction of the memory array;
a third interconnect line extending in a second direction;
wherein the magneto resistive element of at least some of the memory cells is sandwiched between the second and third interconnect lines,
wherein the second interconnect line extends at least partially along all magneto resistive elements in a particular one of the memory cells,
wherein each memory cell includes multiple magneto resistive elements connected in parallel.
2. A non-volatile memory device comprising:
a plurality of memory cells each comprising a magneto resistive element and a selection transistor;
wherein at least some of the memory cells are arranged into a two dimensional array;
a first interconnect line extending in a first direction of the memory array and functioning as a gate electrode of a selection transistor included in each memory cell;
a second interconnect line extending in the first direction of the memory array;
a third interconnect line extending in a second direction;
wherein the magneto resistive element of at least some of the memory cells is sandwiched between the second and third interconnect lines,
wherein the second interconnect line extends at least partially along all magneto resistive elements in a particular one of the memory cells,
wherein each memory cell includes multiple magneto resistive elements connected in series.
3. The non-volatile memory device according to claim 1, wherein each memory cell independently stores one bit of information.
4. A non-volatile memory device comprising:
plurality of memory cells each comprising a magneto resistive element and a selection transistor;
wherein at least some of the memory cells are arranged into a two dimensional array;
a first interconnect line extending in a first direction of the memory array and functioning as a gate electrode of a selection transistor included in each memory cell;
a second interconnect line extending in the first direction of the memory array;
a third interconnect line extending in a second direction;
wherein the magneto resistive element of at least some of the memory cells is sandwiched between the second and third interconnect lines,
wherein the second interconnect line extends at least partially along all magneto resistive elements in a particular one of the memory cells,
wherein each memory cell, includes at least two sets of magneto resistive elements, the magneto resistive elements in each set being connected in parallel to form parallel combinations, the parallel combinations being connected in series.
5. The non-volatile memory device according to claim 1, wherein the memory cells are divided into groups, each group being for storing one bit of information.
6. A non-volatile memory device, comprising:
a plurality of memory cells each comprising a magneto resistive element and a selection transistor;
wherein the memory cells are arranged into a two dimensional array;
a first interconnect line extending in a first direction of the memory array and functioning as a gate electrode of a selection transistor included in each memory cell;
a second interconnect line extending in the first direction of the memory array;
a third interconnect line extending in a second direction;
wherein the magneto resistive element of at least some of the memory cells is sandwiched between the second and third interconnect lines,
wherein the memory cells are divided into groups, each group being for storing one bit of information,
wherein in a group of memory cells, two memory cells are connected in parallel to form a first parallel combination, two other memory cells are connected in parallel to form a second parallel combination, the parallel combinations being connected in series.
7. The non-volatile memory device according to claim 5, wherein writing information to the group of memory cells is performed by magnetizing free layers of all magneto resistive elements in the group of memory cells into a same direction.

8. The non-volatile memory device according to claim 2, wherein the second interconnect line extends across or through multiple memory cells.

9. The non-volatile memory device according to claim 2, wherein each of the cells includes at least three magnetoresistive elements.

10. The non-volatile memory device according to claim 2, wherein the memory cells are divided into groups, each group being for storing one bit of information.

11. The non-volatile memory device according to claim 1, wherein each of the cells includes at least three magnetoresistive elements.

* * * * *